United States Patent
Siegel et al.

(10) Patent No.: US 6,951,125 B2
(45) Date of Patent: Oct. 4, 2005

(54) SYSTEM AND METHOD FOR ALIGNING AN INTEGRATED CIRCUIT DIE ON AN INTEGRATED CIRCUIT SUBSTRATE

(75) Inventors: Harry Michael Siegel, Hurst, TX (US); Anthony M. Chiu, Richardson, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 281 days.

(21) Appl. No.: 10/062,595

(22) Filed: Jan. 31, 2002

(65) Prior Publication Data

US 2003/0140678 A1 Jul. 31, 2003

(51) Int. Cl.$^7$ ............................ B21D 28/04; B23K 1/20; G01R 31/02; H01L 23/48
(52) U.S. Cl. ........................... 72/456; 72/420; 228/165; 228/174; 324/754; 324/761; 257/738; 257/778
(58) Field of Search ................................ 257/737, 772, 257/773, 738, 778, 779, 780; 324/754, 761; 228/165, 174; 72/456, 420

(56) References Cited

U.S. PATENT DOCUMENTS

| | | | | |
|---|---|---|---|---|
| 3,338,084 A | * | 8/1967 | Stegman, Sr. ................. | 72/420 |
| 3,900,257 A | * | 8/1975 | Woolley, Jr. et al. .......... | 72/420 |
| 4,887,452 A | * | 12/1989 | Bakermans .................... | 72/420 |
| 4,997,122 A | * | 3/1991 | Zimmer ........................ | 228/165 |
| 5,726,501 A | * | 3/1998 | Matsubara .................... | 257/778 |
| 5,838,160 A | * | 11/1998 | Beaman et al. .............. | 324/754 |
| 6,335,568 B1 | * | 1/2002 | Yuzawa et al. .............. | 257/738 |

* cited by examiner

*Primary Examiner*—David Jones
(74) *Attorney, Agent, or Firm*—Lisa K. Jorgenson; William A. Munck (57) ABSTRACT

A system and method is disclosed for aligning an integrated circuit die on an integrated circuit substrate. A plurality of deposits of deformable material are placed on the substrate where the integrated circuit die is to be aligned. In one advantageous embodiment a stamping tool is indexed to a first tooling hole and to a second tooling hole in the substrate. The stamping tool imprints the deposits of deformable material to a tolerance of less than one hundred microns with respect to the first and second tooling holes. The imprinted portions of the deposits a form a pocket for receiving the integrated circuit die. This enables the integrated circuit die to be precisely aligned on the substrate in three dimensions.

23 Claims, 5 Drawing Sheets

SYSTEM AND METHOD FOR ALIGNING AN INTEGRATED CIRCUIT DIE ON AN INTEGRATED CIRCUIT SUBSTRATE

TECHNICAL FIELD OF THE INVENTION

The present invention is directed, in general, to integrated circuits and, more specifically, to a system and method for aligning an integrated circuit die on an integrated circuit substrate during the manufacture of an integrated circuit package.

BACKGROUND OF THE INVENTION

An integrated circuit package generally comprises a substrate made of epoxy impregnated fiberglass material, an integrated circuit made of silicon, and an encasing material that surrounds delicate electrical elements to protect them from mechanical damage and environmental exposure. During the manufacture of an integrated circuit package, the integrated circuit portion is generally referred to as an integrated circuit die.

There are certain manufacturing processes for an integrated circuit package (e.g., transfer molding of an exposed integrated circuit die) that require the integrated circuit die to be clamped. In these types of processes it is highly desirable that the integrated circuit die be located accurately in three dimensions. It is also highly desirable that the accurate three dimensional location of the integrated circuit die be repeatable.

The alignment of an integrated circuit die on a substrate is normally considered to be acceptable if the integrated circuit die is placed in its intended position within a tolerance of approximately one hundred microns (100 μm).

The placement of an integrated circuit die on the surface of the substrate may be considered as a problem of aligning the integrated circuit die within a conventional three dimensional rectangular coordinate system comprising an X-axis, a Y-axis and a Z-axis. The X-axis and the Y-axis form a plane that is coincident with the surface of the substrate. The Z-axis is perpendicular to the plane formed by the X-axis and the Y-axis. The value of Z represents the vertical location of the integrated circuit die with respect to the plane surface of the substrate.

To be within the normally acceptable tolerance of one hundred microns (100 μm), the location of the integrated circuit die on the substrate with respect to the X-axis must be within plus or minus one hundred microns (100 μm) of the intended X position. Similarly, the location of the integrated circuit die on the substrate with respect to the Y-axis must be within plus or minus one hundred microns (100 μm) of the intended Y position. Lastly, the location of the integrated circuit die on the substrate with respect to the Z-axis must be within a range of plus or minus twenty five microns (25 μm) to plus or minus fifty microns (50 μm) of the intended Z position.

In addition, the angular alignment of an integrated circuit die on a substrate must be accurate. Assume that the correct angular placement of an integrated circuit die is with a first side parallel to the X-axis and with a second side parallel to the Y-axis. If the integrated circuit die is not correctly aligned in its angular position, then it will be in a rotated position with respect to its correct angular position.

Similarly, it is possible for an integrated circuit die to be angularly misaligned with respect to the vertical Z-axis. Assume that the correct angular placement of an integrated circuit die is for the bottom of the integrated circuit die to be parallel with the surface of the substrate. Then the plane of the bottom of the integrated circuit die is to be perpendicular to the Z-axis. If the bottom of the integrated circuit die is inclined or tilted with respect to the surface of the substrate, then the integrated circuit die will not be in its correct angular position with respect to the vertical Z-axis.

In silicon sensor applications part of the silicon surface of the integrated circuit die is exposed and is not covered by a protective molding. In silicon sensor applications the position of the integrated circuit die must be precisely located with respect to the X, Y, and Z axes in order to have an acceptable yield after the molding process has been performed. That is, in order to improve the yield in silicon sensor applications the tolerance of the location of the integrated circuit die on the substrate must be minimized. This requires minimizing the variations in the X, Y and Z locations of the integrated circuit die, minimizing the angular rotation of the integrated circuit die in the X-Y plane, and minimizing the angular tilt of the integrated circuit die with respect to the Z-axis.

When an integrated circuit substrate is manufactured tooling holes are drilled in the surface of the substrate. Then a copper pattern is etched in the substrate using photolithography techniques. The alignment of the copper pattern measured with respect to the position of the tooling holes is within a tolerance of one hundred microns (100 μm). The misalignment of the copper pattern with a respect to the tooling holes that are represented by the tolerance of one hundred microns (100 μm) is due to the accumulation of conventional manufacturing tolerances during the manufacturing process. The misalignment is due in part to alignment errors between the mask used to etch the copper pattern and the tooling holes on the substrate.

During the placement of the integrated circuit die on the substrate, optical alignment is used to place the integrated circuit die with respect to certain fiducial reference points that are created in the etched copper pattern on the substrate. The fiducial reference points may be misaligned with respect to the tooling holes by as much as one hundred microns (100 μm). This misalignment is a major source of error in the placement of an integrated circuit die.

An epoxy based glue is first applied to the substrate before the integrated circuit die is placed into position. The integrated circuit die is then placed in contact with the epoxy based glue. After the integrated circuit die has been placed into position, the substrate is heated for one to two hours in order to cure the epoxy based glue and solidify the bond between the integrated circuit die and the substrate.

During the curing process the integrated circuit die can shift its position with respect to the X-axis, or with respect to the Y-axis, or with respect to the Z-axis. This shift in position may occur while the volatile material in the epoxy based glue is vaporizing. The misalignment between the integrated circuit die and the copper pattern on the substrate after cure is normally about plus or minus fifty microns (50 μm) in the X direction and in the Y direction. The integrated circuit die may also tilt up or down in the Z direction as much as fifty microns (50 μm). The misalignment caused by the curing process is also a major source of error in the placement of an integrated circuit die. There can be a cumulative misalignment of as much as one hundred fifty microns (150 μm) between the integrated circuit die and the tooling holes of the substrate.

There is therefore a need in the art for an improved system and method for aligning an integrated circuit die on an integrated circuit substrate during the manufacture of an integrated circuit package. There is also a need in the art for an improved system and method for minimizing the misalignment between an integrated circuit die and the copper pattern on a substrate during the manufacture of an integrated circuit package.

SUMMARY OF THE INVENTION

To address the deficiencies of the prior art, it is a primary object of the present invention to provide an improved system and method for aligning an integrated circuit die on an integrated circuit substrate.

The present invention generally comprises an improved system and method for manufacturing an integrated circuit package. The present invention is capable of precisely aligning an integrated circuit die on an integrated circuit substrate. A plurality of deposits of deformable material are placed on the integrated circuit substrate where the integrated circuit die is to be aligned. In one advantageous embodiment a stamping tool is indexed to a first tooling hole and to a second tooling hole in the integrated circuit substrate. The first and second tooling holes are the same tooling holes that are used to align the substrate in a molding process. The stamping tool imprints the deposits of deformable material to a tolerance of less than one hundred microns with respect to the first and second tooling holes. The imprinted portions of the deposits form a pocket for receiving the integrated circuit die. This enables the integrated circuit die to be precisely aligned on the integrated circuit substrate.

It is an object of the present invention to provide a stamping tool that is capable of imprinting at least one deposit of deformable material on an integrated circuit substrate in order to precisely align an integrated circuit die on the integrated circuit substrate.

It is also an object of the present invention to provide a stamping tool that is capable of aligning a position of said integrated circuit on an integrated circuit substrate to within a tolerance of less than one hundred microns.

It is another object of the present invention to provide a stamping tool that is capable of creating at least one geometrical alignment guide feature in at least one deposit of deformable material on an integrated circuit substrate.

It is another object of the present invention to provide an improved system and method that is capable of creating at least one geometrical alignment guide feature that is located with respect to the same tooling holes that are used to align a substrate during a molding process.

It is another object of the present invention to provide an improved system and method for precisely aligning an integrated circuit die on an integrated circuit substrate.

It is yet another object of the present invention to provide an improved system and method for heating a stamping tool to rapidly deform deposits of deformable material on an integrated circuit substrate.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior uses, as well as to future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 15, discussed below, and the various embodiments used to describe the principles of the present invention in this patent document are by way of illustration only and should not be construed in any way to limit the scope of the invention. Those skilled in the art will understand that the principles of the present invention may be implemented for any suitably arranged integrated circuit die and integrated circuit substrate.

Figures 1, 2:
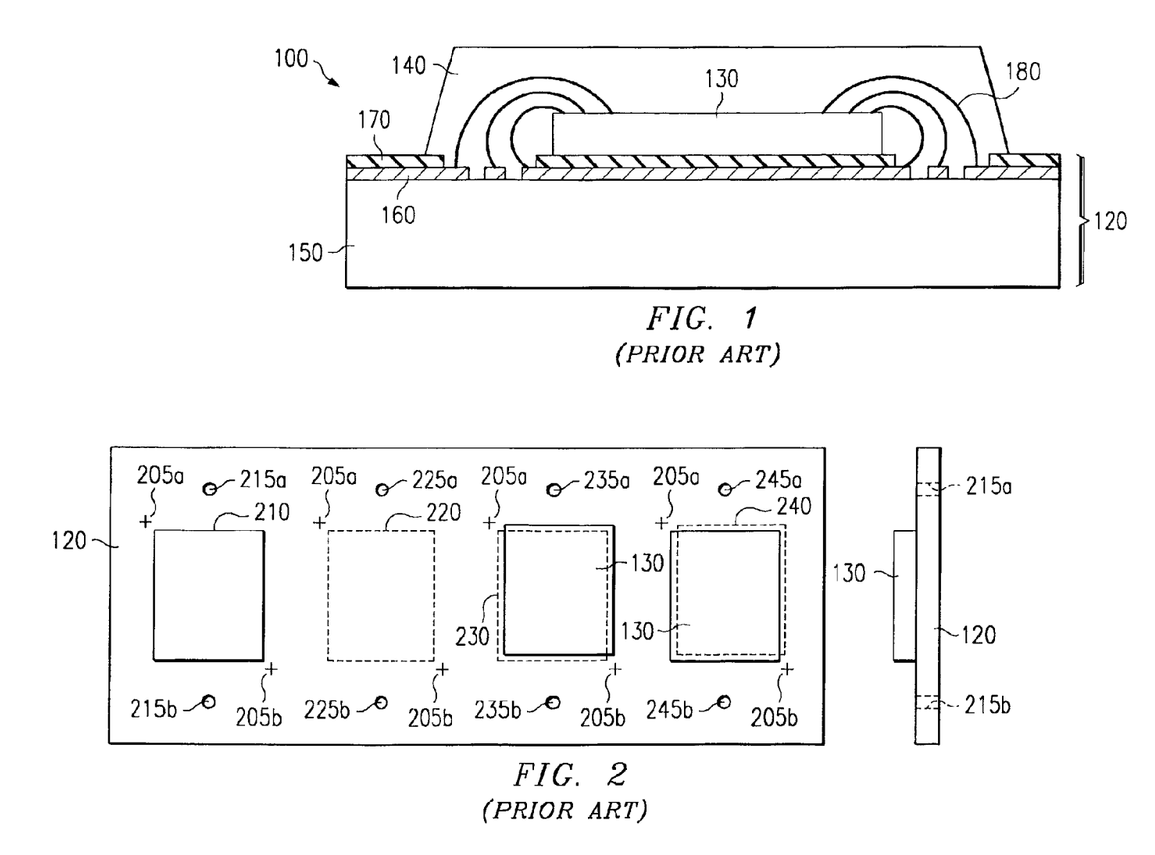
FIG. 1 illustrates a sectional side view of an exemplary prior art integrated circuit package.
FIG. 2 illustrates how an integrated circuit die may shift its position with respect to its original mounting position on a substrate after the cure of an epoxy based glue that attaches it to the substrate.

FIG. 1 illustrates a sectional side view of an exemplary prior art integrated circuit package 100. Integrated circuit package 100 comprises substrate 120, integrated circuit die 130, and protective material 140. Substrate 120 comprises core layer 150, metal layer 160, and dielectric layer 170. As shown in FIG. 1, electrical leads 180 connect integrated circuit die 130 with metal layer 160.

As is well known in the art, during the manufacture of integrated circuit package 100 a plurality of tooling holes are drilled into substrate 120. FIG. 2 illustrates a portion of substrate 120 showing four sets of tooling holes. The first set comprises tooling holes 215a and 215b. The second set comprises tooling holes 225a and 225b. The third set comprises tooling holes 235a and 235b. The fourth set comprises tooling holes 245a and 245b.

Then an integrated circuit die 130 is placed into position on substrate 120. The alignment of integrated circuit die 130 on substrate 120 is made with respect to fiducial reference points that are located on substrate 120. An exemplary fiducial reference point 205a and an exemplary fiducial reference point 205b are represented in FIG. 2 by small crosses. FIG. 2 illustrates an ideal position 210 for integrated circuit die 130 with respect to fiducial reference point 205a and to fiducial reference point 205b.

During the die attach process a die attach machine (not shown) uses optical pattern recognition techniques to place integrated circuit die 130 on substrate 120. The die attach machine locates fiducial reference points 205a and 205b and places integrated circuit die 130 on substrate 120 using the fiducial reference points 205a and 205b to guide the placement process.

Fiducial reference points 205a and 205b may be misaligned with respect to tooling holes 215a and 215b by as much as one hundred microns (100 $\mu$m). This misalignment is a major source of the "placement error" that may occur when a die attach machine places integrated circuit die 130 on substrate 120.

The ideal position for integrated circuit die 130 is also shown in dotted outline 220 between tooling hole 225a and tooling hole 225b. Dotted outline 220 represents the location on substrate 120 where an epoxy based glue is to be applied to glue integrated circuit die 130 to substrate 120. First the epoxy based glue is applied to substrate 120 within the area surrounded by dotted outline 220. Then integrated circuit die 130 is placed on the glued area and the epoxy based glue is allowed to cure.

Sometimes integrated circuit die 130 does not move during the cure process of the epoxy based glue. When this happens integrated circuit die 130 remains positioned on substrate 120 where it was placed by the die attach machine. However, in many instances integrated circuit die 130 will shift its position with respect to its original mounting position 220 on substrate 120 during the cure process of the epoxy based glue. The shift in position may be caused by shrinkage of the epoxy based glue during the cure process, the presence of gas pockets in the epoxy based glue, and other similar types of manufacturing variations.

This is one factor that causes integrated circuit die 130 to be misaligned with respect to the fiducial reference points in substrate 120. FIG. 2 illustrates two such cases of misalignment. Integrated circuit die 130 between tooling hole 235a and tooling hole 235b is shifted up and to the right of its original ideal mounting position 230. Integrated circuit die 130 between tooling hole 245a and tooling hole 245b is shifted down and to the left of its original ideal position 240. As will be more fully described, the system and method of the present invention prevents these types of misalignments from occurring when integrated circuit die 130 is mounted on substrate 120.

Integrated circuit die 130 may also experience angular misalignment on substrate 120 by being placed on substrate 120 at an incorrect angle.

FIG. 2 also illustrates an end view of substrate 120 showing the ideal position of integrated circuit die 130 between tooling hole 215a and tooling hole 215b.

The alignment of integrated circuit die 130 on substrate 120 is normally considered to be acceptable if integrated circuit die 130 is placed in its intended position within a tolerance of one hundred microns (100 $\mu$m). In particular, a typical tolerance between the tooling holes of substrate 120 and the fiducial reference points etched in substrate 120 is about one hundred microns (100 $\mu$m). Normally this amount of variation is not important.

However, in some molding applications (e.g., exposed die molding in which clamping of the die surface is required) the position of fiducial reference points (and other features) with respect to the tooling holes of substrate 120 becomes very important for the success of the molding application. It is therefore desirable to reduce the tolerance in the positioning of fiducial reference points with respect to the tooling holes of substrate 120 to less than one hundred microns (100 $\mu$m).

As will be more fully explained, the system and method of the present invention creates precisely located features within deformable material on substrate 120 using an imprinting operation that is directly indexed to the tooling holes of substrate 120.

During the manufacturing process of integrated circuit package 100 deformable material may be deposited on substrate 120. For example, such deformable material may comprises a soft metal like gold, tin or solder. Alternatively, deformable material (e.g., polymers) may be applied to substrate 120 specifically for the purpose of being imprinted in accordance with the principles of the present invention.

Figure 3:
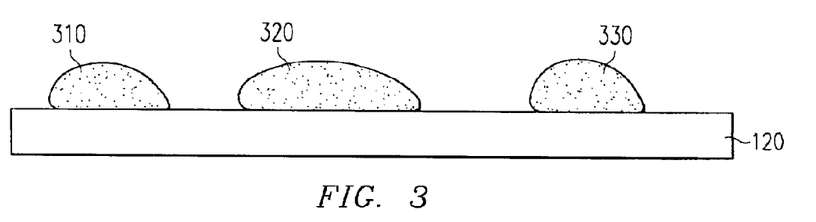
FIG. 3 illustrates three exemplary deposits of deformable material mounted on a substrate.
Figure 4:
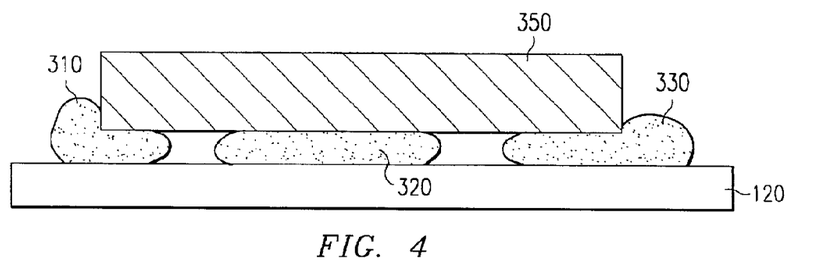
FIG. 4 illustrates how a stamp of the present invention may imprint and deform the three exemplary deposits of deformable material mounted on a substrate shown in FIG. 3.

FIG. 3 illustrates three exemplary deposits of deformable material, 310, 320 and 330, mounted on substrate 120. During the imprinting process of the present invention a stamp 350 is pressed down upon the deformable material as shown in FIG. 4. Stamp 350 flattens those portions of deformable material that stamp 350 is pressed down upon. As shown in FIG. 4, stamp 350 flattens a portion of deformable material 310 and flattens a portion of deformable material 330. All of deformable material 320 is located under stamp 350. Therefore stamp 350 flattens the entire surface of deformable material 320.

Figure 5:
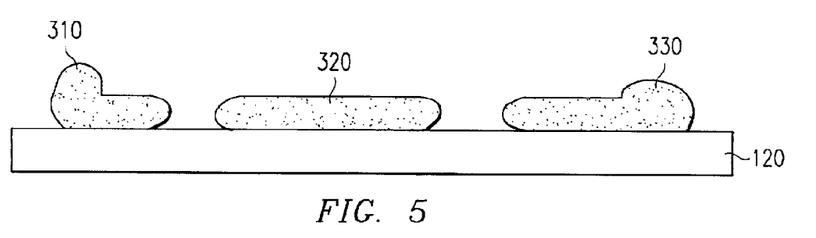
FIG. 5 illustrates the form of the three exemplary deposits of deformable material mounted on a substrate shown in FIG. 4 after they have been imprinted and deformed by a stamp of the present invention.

FIG. 5 illustrates the form of the three exemplary deposits of deformable material, 310, 320 and 330, mounted on substrate 120 after they have been imprinted and deformed by stamp 350. The flattened portions imprinted within deformable material, 310, 320 and 330, are capable of providing precisely defined and located features on substrate 120. The flattened portions imprinted within deformable material, 310, 320 and 330, are also capable of providing precisely defined and located features on substrate 120 that have a lower tolerance than prior art tolerances on substrate 120.

Figure 6:
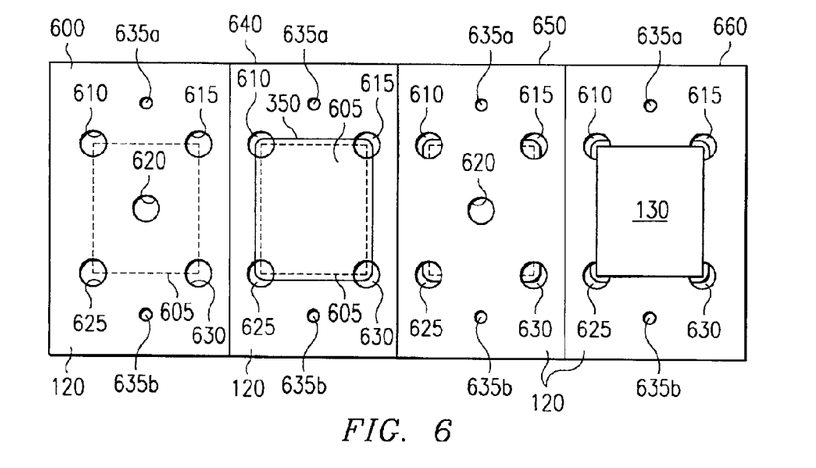
FIG. 6 illustrates four plan views of five deposits of deformable material mounted on a substrate showing how the impressions made the on deformable material mounted on the substrate by the stamping tool of the present invention enable an integrated circuit die to be properly aligned on the surface of the substrate.

FIG. 6 illustrates how the flattened portions imprinted within deformable material mounted on substrate 120 enable an integrated circuit die 130 to be properly aligned on the surface of substrate 120. FIG. 6 illustrates four plan views, 600, 640, 650 and 660, of five deposits of deformable material, 610, 615, 620, 625 and 630, mounted on substrate 120.

Plan view 600 shows the ideal location for integrated circuit die 130 on substrate 120 by indicating an area enclosed by dotted line 605. Tooling hole 635a and tooling hole 635b are also shown. Plan view 600 shows that a sit of deformable material 610 is placed at a location where the upper left hand corner of integrated circuit die 130 will be placed. Similarly, plan view 600 shows that a deposit of deformable material 615 is placed at a location where the upper right hand corner of integrated circuit die 130 will be placed. Plan view 600 also shows that a deposit of deformable material 625 is placed at a location where the lower left hand corner of integrated circuit die 130 will be placed. Plan view 600 also shows that a deposit of deformable material 630 is placed at a location where the lower right hand corner of integrated circuit die 130 will be placed. Lastly, plan view 600 shows that a deposit of deformable material 620 is placed at a location in the center of the area enclosed by dotted line 605.

Plan view 640 shows how stamp 350 of the present invention is lowered onto and imprinted upon the deposits of deformable material, 610, 615, 620, 625 and 630. The bottom surface of stamp 350 has portions that precisely imprint an outline of the corners of the area enclosed by dotted line 605. In this manner stamp 350 imprints the ideal location for integrated circuit die 130 on the deposits of deformable material. As will be more fully explained, the exact location of stamp 350 with respect to the locations of the deposits of deformable material, 610, 615, 620, 625 and 630, is indexed to tooling hole 635a and to tooling hole 635b.

Plan view 650 shows the appearance of the deposits of deformable material, 610, 615, 620, 625 and 630 after stamp 350 has been removed. Deformable material 620 in the center is flattened over its entire surface. Each one of the deposits of deformable materials at the corners, 610, 615, 625 and 630, is imprinted and flattened only over a corner portion. Each of the four corners of the bottom surface of stamp 350 stamps its respective deposit of deformable material. Plan view 660 shows how integrated circuit die 130 may then be placed precisely within the flattened imprinted corners of the deposits of deformable material, 610, 615, 625 and 630. Flattened deposit of deformable material 620 (not shown in plan view 660) provides support for the center of integrated circuit die 130.

Using stamp 350 to imprint the deposits of deformable material, 610, 615, 620, 625 and 630, in the manner described above creates a "pocket" within the deposits of deformable material. The "pocket" is used to accurately align and position integrated circuit die 130 in the X, Y and Z directions with respect to the surface of substrate 120. The location of the bottom of the "pocket" determines the distance of the bottom of integrated circuit die 130 from the surface of substrate 120.

Figure 7:
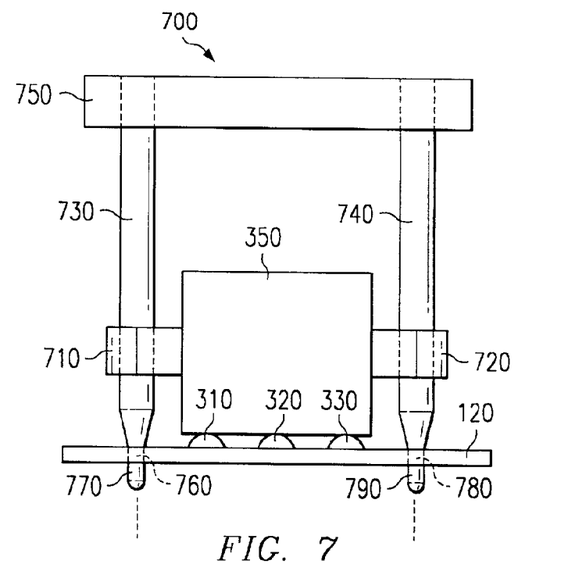
FIG. 7 illustrates a side view of an advantageous embodiment of a stamping tool of the present invention.

FIG. 7 illustrates a side view of an advantageous embodiment of stamping tool 700 of the present invention. Stamping tool 700 comprises stamp 350. Stamp 350 is shown in FIG. 7 in contact with deposits of deformable material 310, 320 and 330 mounted on substrate 120. The sides of stamp 350 are attached to stamp slide member 710 and to stamp slide member 720. Stamp slide member 710 has portions forming a cylindrically shaped aperture adapted to receive a cylindrically shaped stamping tool column 730. Stamp slide member 720 has portions forming a cylindrically shaped aperture adapted to receive a cylindrically shaped stamping tool column 740. The design is not limited to the use of a cylindrical shape and it is understood that other shapes may be used.

Stamping tool cross member 750 is attached to the upper end of stamping tool column 730. Stamping tool cross member 750 is also attached to the upper end of stamping tool column 740. Stamping tool cross member 750 vertically aligns the stamping tool column 730 and stamping tool column 740.

The lower end 770 of stamping tool column 730 is machined to precisely fit tooling hole 760 in substrate 120. The precision of the fit has a tolerance that is less than twenty five microns (25 μm). Similarly, the lower end 790 of stamping tool column 740 is machined to precisely fit tooling hole 780 in substrate 120. The precision of the fit of lower end 790 to tooling hole 780 is the same as the precision of the fit of lower end 770 to tooling hole 760.

The precision of the fit of stamping tool column 730 through the aperture of stamp slide member 710 is also the same as the precision of the fit of lower end 770 through tooling hole 760. The precision of the fit of stamping tool column 740 through the aperture of stamp slide member 720 is the same as the precision of the fit of stamping tool column 730 through the aperture of stamp slide member 710.

Stamping tool 700 is able to precisely locate the placement of stamp 350 with respect to tooling holes 760 and 780 to the tolerance described above. In operation, stamp 350 is first moved up against stamping tool cross member 750 and held in place by a latch (not shown). Then lower end 770 of stamping tool column 730 is placed within tooling hole 760 and lower end 790 of stamping tool column 740 is placed within tooling hole 780. Stamp 350 is then released and is moved down by hand and imprinted on the deposits of deformable material 310, 320 and 330.

A stop mechanism (not shown) in stamping tool 700 controls how far down stamp 350 may move. The stop mechanism determines the distance from substrate 120 to the level imprinted on the deposits of deformable material 310, 320 and 330. The setting of the stop mechanism controls the vertical location (i.e., the position along the Z axis) of the "pocket" that is imprinted for integrated circuit die 130. The stop mechanism also ensures that the bottom of the "pocket" will be parallel to the surface of substrate 120.

After the imprinting process is completed, stamp 350 is moved back up and latched into its latched position. Stamping tool 700 is then removed from substrate 120.

Figure 8:
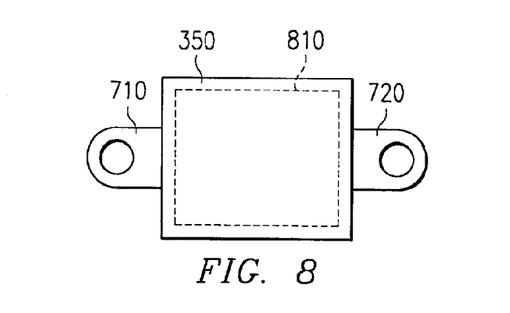
FIG. 8 illustrates a top view of a stamp used in the stamping tool of the present invention.
Figure 9:
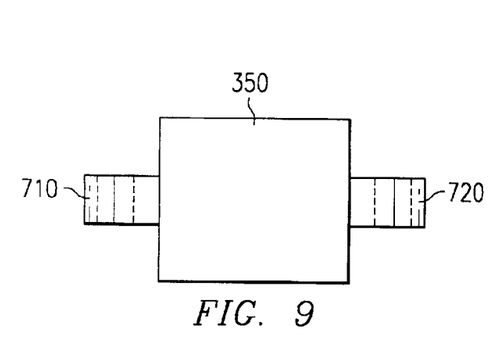
FIG. 9 illustrates a side view of a stamp used in the stamping tool of the present invention.
Figure 10:
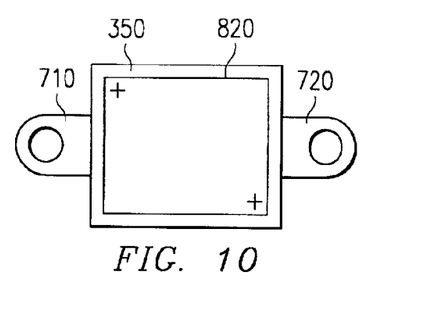
FIG. 10 illustrates a bottom view of a stamp used in the stamping tool of the present invention.

FIG. 8 illustrates a top view of stamp 350 showing how stamp slide member 710 and stamp slide member 720 are attached to stamp 350. Dotted line 810 indicates the position of stamping surface 820 on the bottom of stamp 850 (shown in FIG. 10) in relation to the top of stamp 350. FIG. 9 illustrates a side view of stamp 350 showing the vertical apertures through stamp slide member 710 and stamp slide member 720. FIG. 10 illustrates a bottom view of stamp 350 showing stamping surface 820 on the bottom of stamp 350. The two crosses on stamping surface 820 indicate that locator markings may be formed within stamping surface 820 to be imprinted on the deposits of deformable material.

Figure 11:
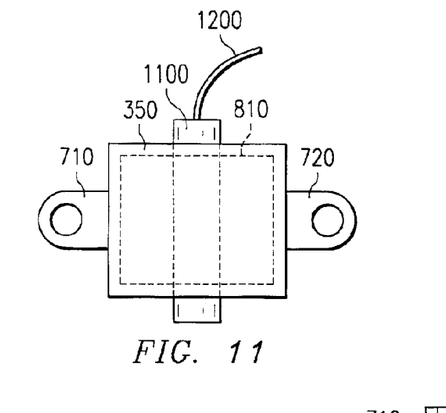
FIG. 11 illustrates a top view of an alternate embodiment of a stamp used in the stamping tool of the present invention showing a heating element placed with the stamp.
Figure 12:
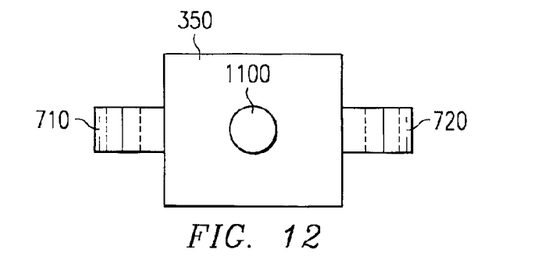
FIG. 12 illustrates a side view of the alternate embodiment of the stamp shown in FIG. 8.

FIG. 11 illustrates a top view of an alternate embodiment of stamp 350. This embodiment of stamp 350 comprises an electrically powered heating element 1100 (and associated power cord 1200). Heating element 1100 within stamp 350 is activated after stamp 350 has been moved into position and pressed against deposits of deformable material 310, 320 and 330 on substrate 120. Heat from heating element 1100 passes through stamp 350 and heats the deposits of deformable material 310, 320 and 330 in order to soften them and reduce the time required for the imprinting process. FIG. 12 illustrates a side view of the alternate embodiment of stamp 350 showing the placement of heating element 1100 within stamp 350.

Figure 13:
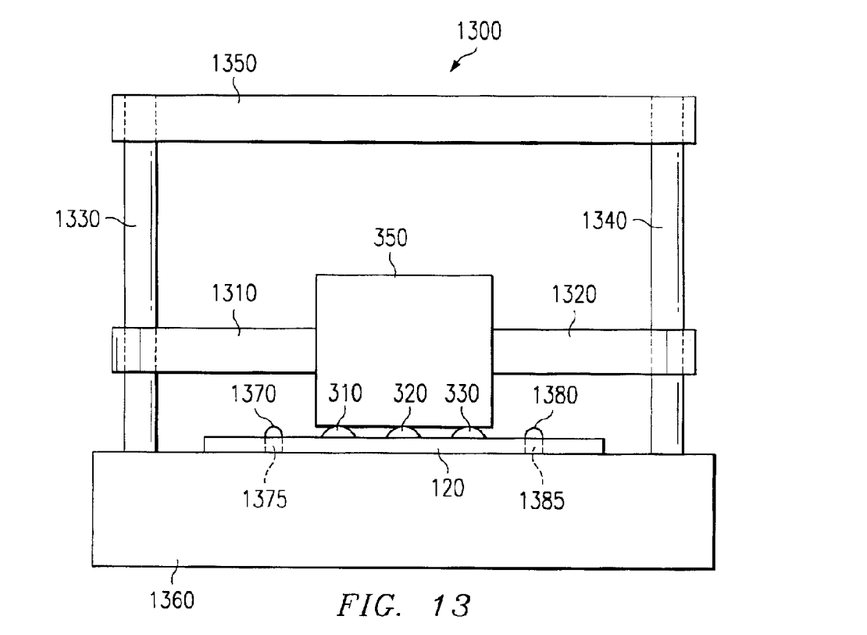
FIG. 13 illustrates a side view of an alternate advantageous embodiment of a stamping tool of the present invention.

FIG. 13 illustrates a side view of an alternate advantageous embodiment of a stamping tool 1300 of the present invention. Stamping tool 1300 is designed to be operated by automatic equipment. Stamping tool 1300 comprises stamp 350. Stamp 350 is shown in FIG. 13 in contact with deposits of deformable material 310, 320 and 330 mounted on substrate 120. The sides of stamp 350 are attached to stamp slide member 1310 and to stamp slide member 1320. Stamp slide member 1310 has portions forming a cylindrically shaped aperture adapted to receive a cylindrically shaped stamping tool column 1330. Stamp slide member 1320 has portions forming a cylindrically shaped aperture adapted to receive a cylindrically shaped stamping tool column 1340. The design is not limited to the use of a cylindrical shape and it is understood that other shapes may be used.

Stamping tool cross member 1350 is attached to the upper end of stamping tool column 1330. Stamping tool cross member 1350 is also attached to the upper end of stamping tool column 1340. Stamping tool cross member 1350 vertically aligns the stamping tool column 1330 and stamping tool column 1340. The lower end of stamping tool column 1330 and the lower end of stamping tool column 1340 are attached to stamping tool base 1360.

Stamping tool base 1360 comprises tooling hole alignment button 1370 designed to fit within tooling hole 1375 in substrate 120. Stamping tool base 1360 also comprises tooling hole alignment button 1380 designed to fit within tooling hole 1385 of substrate 120. Tooling hole alignment button 1370 is machined to precisely fit tooling hole 1375 in substrate 120. The precision of the fit has a tolerance that is less than twenty five microns (25 μm). Similarly, tooling hole alignment button 1380 is machined to precisely fit tooling hole 1385 in substrate 120. The precision of the fit of tooling hole alignment button 1380 to tooling hole 1385 is the same as the precision of the fit of tooling hole alignment button 1370 to tooling hole 1375.

The precision of the fit of stamping tool column 1330 through the aperture of stamp slide member 1310 is also the same as the precision of the fit of tooling hole alignment button 1370 to tooling hole 1375. The precision of the fit of stamping tool column 1340 through the aperture of stamp slide member 1320 is the same as the precision of the fit of stamping tool column 1330 through the aperture of stamp slide member 1310.

Stamping tool 1300 is able to precisely locate the placement of stamp 350 with respect to tooling holes 1375 and 1385 to the tolerance described above. In operation, stamp 350 is first moved up against stamping tool cross member 1350 and held in place by a latch (not shown). Then tooling hole 1375 of substrate 120 is placed over tooling hole alignment button 1370 and tooling hole 1385 is placed over tooling hole alignment button 1380. Substrate 120 is then placed against the upper surface of stamping tool base 1360. Stamp 350 is then released and is moved down by automatic equipment and imprinted on the deposits of deformable material 310, 320 and 330.

A stop mechanism (not shown) in stamping tool 1300 controls how far down stamp 350 may move. The stop mechanism determines the distance from substrate 120 to the level imprinted on the deposits of deformable material 310, 320 and 330. The setting of the stop mechanism controls the vertical location (i.e., the position along the Z axis) of the "pocket" that is imprinted for integrated circuit die 130. The stop mechanism also ensures that the bottom of the "pocket" will be parallel to the surface of substrate 120. After the imprinting process is completed, stamp 350 is moved back up and latched into its latched position. Substrate 120 is then removed from stamping tool 1300.

Figure 14:
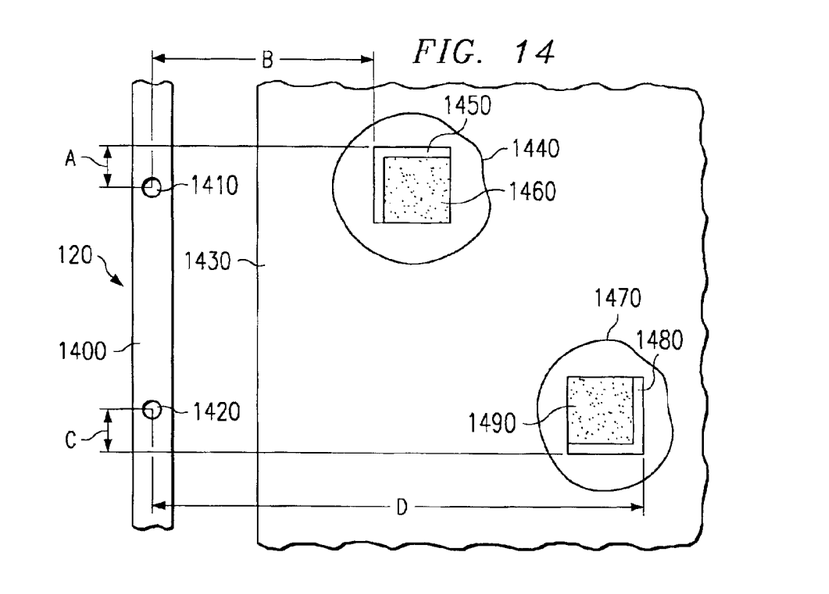
FIG. 14 illustrates the alignment of impressions made in deformable deposits on a substrate with respect to tooling holes drilled in the substrate in accordance with the principles of the present invention.

FIG. 14 illustrates the alignment of impressions made in deformable deposits on a substrate with respect to tooling holes in the substrate. FIG. 14 shows tooling hole 1410 and tooling hole 1420 that have been drilled in a first portion 1400 of substrate 120. FIG. 14 also shows a first deposit of deformable material 1440 and a second deposit of deformable material 1470 on a second portion 1430 of substrate 120.

FIG. 14 illustrates the alignment of impressions made in deformable deposits 1440 and 1470 after stamp 350 has completed the imprinting process. A first imprinted portion 1450 of deformable material 1440 represents a guide feature impressed by a corner of stamp 350. First imprinted portion 1450 precisely marks the location of the imprint made by stamp 350. A second imprinted portion 1460 of deformable material 1440 represents a flat portion of deformable material 1440 imprinted by stamp 350.

It is possible to precisely determine the vertical distance (designated with the letter "A") from the center of tooling hole 1410 to a horizontal line made by extending the top edge of first imprinted portion 1450 to first portion 1400 of substrate 120. It is also possible to precisely determine the horizontal distance (designated with the letter "B") from the center of tooling hole 1410 to the left edge of first imprinted portion 1450.

Similarly, a first imprinted portion 1480 of deformable material 1470 represents a guide feature impressed by a corner of stamp 350. First imprinted portion 1480 precisely marks the location of the imprint made by stamp 350. A second imprinted portion 1490 of deformable material 1470 represents a flat portion of deformable material 1470 imprinted by stamp 350.

It is possible to precisely determine the vertical distance (designated with the letter "C") from the center of tooling hole 1420 to a horizontal line made by extending the bottom edge of first imprinted portion 1480 to first portion 1400 of substrate 120. It is also possible to precisely determine the horizontal distance (designated with the letter "D") from the center of tooling hole 1420 to the right edge of first imprinted portion 1480.

The features imprinted by stamp 350 on deformable material 1440 and on deformable material 1470 may be precisely located with respect to the known locations of tooling hole 1410 and tooling hole 1420.

The principles of the present invention enable geometric features to be created in deformable material that has been deposited on a substrate. The geometric features may serve as precision spacers (i.e., stand off supports) for an integrated circuit die 130. The precision spacers of the present invention accurately control the bonded distance between the integrated circuit die 130 and the substrate 120 during the die attach process. The imprinting process of the present invention is capable of creating highly co-planar supports that have surfaces that are precisely aligned with the surface of substrate 120.

The principles of the present invention also enable a "pocket" to be created in deformable material that has been deposited on a substrate. The imprinted deposits of deformable material of the present invention form an accurately located "pocket" for receiving an integrated circuit die 130 during an automated process of attaching the die to substrate 120. The "pocket" accurately aligns and positions integrated circuit die 130 in the X, Y and Z directions with respect to the surface of substrate 120. The location of the bottom of the "pocket" determines the distance of the bottom of integrated circuit die 130 from the surface of substrate 120.

Figure 15:
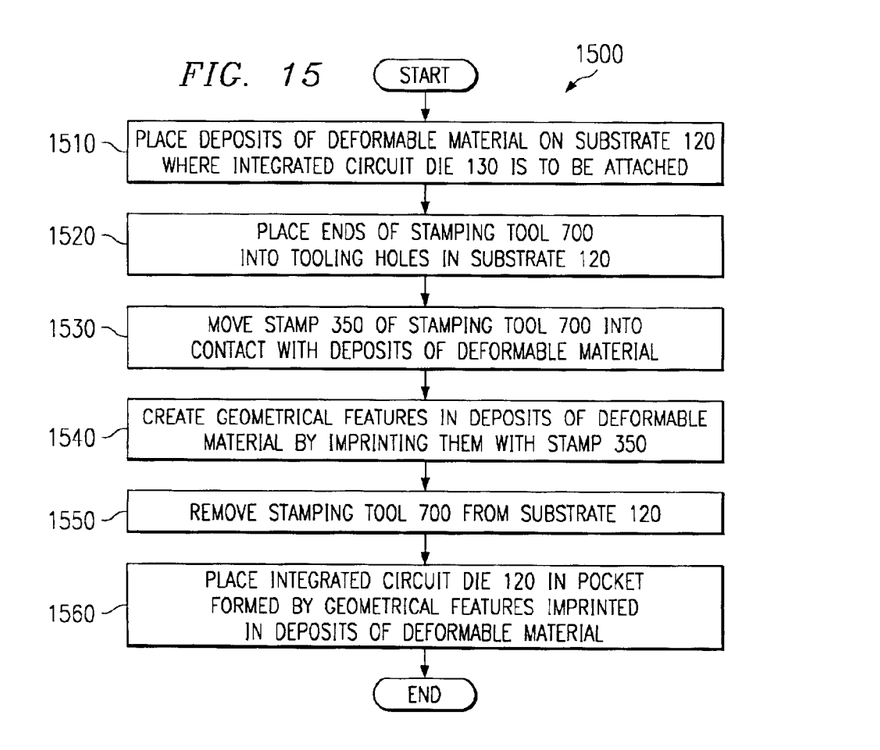
FIG. 15 illustrates a flow chart of an advantageous embodiment of a method of the present invention for aligning an integrated circuit die on an integrated circuit substrate during the manufacture of an integrated circuit package.

FIG. 15 illustrates a flow chart of an advantageous embodiment of a method of the present invention for aligning integrated circuit die 130 on integrated circuit substrate 120 during the manufacture of integrated circuit package 100. The steps of the method are generally denoted with reference numeral 1500.

The first step of the method is to place deposits of deformable material 610, 615, 620, 625 and 630 on substrate 120 where integrated circuit die 130 is to be attached (step 1510). Then place lower end 770 of stamping tool 700 into tooling hole 635a in substrate 120 and place lower end 790 of stamping tool 700 into tooling hole 635b in substrate 120 (step 1520). Then move stamp 350 of stamping tool 700 into contact with the deposits of deformable material 610, 615, 620, 625 and 630 on substrate 120 (step 1530). Next create geometrical features in the deposits of deformable material 610, 615, 620, 625 and 630 on substrate 120 by imprinting them with stamp 350 (step 1540).

Then remove stamping tool 700 from substrate 120 (step 1550). Then place integrated circuit die 130 into a pocket formed by the geometrical features imprinted in the deposits of deformable material 610, 615, 620, 625 and 630 on substrate 120 by stamp 350 (step 1560). The method described above is one advantageous embodiment of a method of the present invention. Other methods may also be used that employ the techniques of the present invention that are described in this patent document.

Although the present invention has been described in detail, those skilled in the art will understand that various changes, substitutions, and alterations herein may be made without departing from the spirit and scope of the invention it its broadest form.

What is claimed is:

1. A stamping tool comprising:
   a stamp capable of imprinting at least one deposit of deformable material on an integrated circuit substrate;
   wherein said stamping tool is capable of aligning a position of said stamp with respect to at least one tooling hole in said integrated circuit substrate.

2. The stamping tool as set forth in claim 1 wherein said stamping tool is capable of aligning a position of said stamp with respect to at least one tooling hole in said integrated circuit substrate to within a tolerance of less than one hundred microns.

3. The stamping tool as set forth in claim 1 comprising:
   a first stamping tool column having a lower end capable of fitting within a first tooling hole in said integrated circuit substrate;
   a second stamping tool column having a lower end capable of fitting within a second tooling hole in said integrated circuit substrate;
   a stamping tool cross member attached to an upper end of said first stamping tool column and attached to an upper end of said second stamping tool column;
   a first stamp slide member attached to a first side of said stamp, said first stamp slide member having portions that form an aperture for slidably receiving said first stamping tool column; and
   a second stamp slide member attached to a second side of said stamp, said second stamp slide member having portions that form an aperture for slidably receiving said second stamping tool column;
   wherein said stamp may be slidably disposed on said first stamping tool column and on said second stamping tool column.

4. The stamping tool as set forth in claim 3 wherein said stamping tool is capable of aligning a position of said stamp with respect to a location of said first tooling hole in said integrated circuit substrate to within a tolerance of less than one hundred microns; and
   wherein said stamping tool is capable of aligning a position of said stamp with respect to a location of said second tooling hole in said integrated circuit substrate to within a tolerance of less than one hundred microns.

5. The stamping tool as set forth in claim 3
   wherein said lower end of said first stamping tool column is capable of fitting within said first tooling hole in said integrated circuit substrate to within a tolerance of less than one hundred microns; and
   wherein said lower end of said second stamping tool column is capable of fitting within said second tooling hole in said integrated circuit substrate to within a tolerance of less than one hundred microns.

6. The stamping tool as set forth in claim 5
   wherein said first stamping tool column is capable of slidably fitting within said first slide member attached to said stamp to within a tolerance of less than one hundred microns; and
   wherein said second stamping tool column is capable of slidably fitting within said second slide member attached to said stamp to within a tolerance of less than one hundred microns.

7. The stamping tool as set forth in claim 3 further comprising a heating element associated with said stamp.

8. The stamping tool as set forth in claim 1 comprising:
   a stamping tool base comprising a first tooling hole alignment button capable of fitting within a first tooling hole in said integrated circuit substrate and a second tooling hole alignment button capable of fitting within a second tooling hole in said integrated circuit substrate;

a first stamping tool column having a lower end attached to said stamping tool base;

a second stamping tool column having a lower end attached to said stamping tool base;

a stamping tool cross member attached to an upper end of said first stamping tool column and attached to an upper end of said second stamping tool column;

a first stamp slide member attached to a first side of said stamp, said first stamp slide member having portions that form an aperture for slidably receiving said first stamping tool column; and a second stamp slide member attached to a second side of said stamp, said second stamp slide member having portions that form an aperture for slidably receiving said second stamping tool column;

wherein said stamp may be slidably disposed on said first stamping tool column and on said second stamping tool column.

9. The stamping tool as set forth in claim 8 wherein said stamping tool is capable of aligning a position of said stamp with respect to a location of said first tooling hole in said integrated circuit substrate to within a tolerance of less than one hundred microns; and wherein said stamping tool is capable of aligning a position of said stamp with respect to a location of said second tooling hole in said integrated circuit substrate to within a tolerance of less than one hundred microns.

10. The stamping tool as set forth in claim 8 wherein said first tooling hole alignment button is capable of fitting within said first tooling hole in said integrated circuit substrate to within a tolerance of less than one hundred microns; and wherein said second tooling hole alignment button is capable of fitting within said second tooling hole in said integrated circuit substrate to within a tolerance of less than one hundred microns.

11. The stamping tool as set forth in claim 10 wherein said first stamping tool column is capable of slidably fitting within said first slide member attached to said stamp to within a tolerance of less than one hundred microns; and wherein said second stamping tool column is capable of slidably fitting within said second slide member attached to said stamp to within a tolerance of less than one hundred microns.

12. The stamping tool as set forth in claim 8 further comprising a heating element associated with said stamp.

13. The stamping tool of claim 1, wherein the at least one deposit of deformable material on the integrated circuit substrate is located where an integrated circuit die is to be attached to the integrated circuit substrate.

14. A method for aligning an integrated circuit die on an integrated circuit substrate, the method comprising the steps of:

placing a plurality of deposits of deformable material on said integrated circuit substrate where said integrated circuit die is to be attached to said integrated circuit substrate;

placing a stamping tool into at least one tooling hole within said integrated circuit substrate;

imprinting said plurality of deposits of deformable material with said stamping tool; and placing said integrated circuit die into a pocket formed in said plurality of deposits of deformable material.

15. The method as set forth in claim 14 wherein said stamping tool is capable of imprinting said plurality of deposits of deformable material to within a tolerance of less than one hundred microns with respect to at least one tooling hole in said integrated circuit substrate.

16. The method as set forth in claim 14 wherein said plurality of deposits of deformable material is composed of one of: a metal, a solder material and a polymer material.

17. The method as set forth in claim 15 further comprising the step of heating said deposits of deformable material.

18. A method for aligning an integrated circuit die on an integrated circuit substrate of the type comprising a first tooling hole and a second tooling hole, the method comprising the steps of:

placing a plurality of deposits of deformable material on said integrated circuit substrate where said integrated circuit die is to be attached to said integrated circuit substrate;

placing said integrated circuit substrate on a stamping tool base of a stamping tool;

imprinting said plurality of deposits of deformable material with a stamp of said stamping tool;

removing said integrated circuit substrate from said stamping tool base of said stamping tool; and placing said integrated circuit die into a pocket formed in said plurality of deposits of deformable material created by imprinting said plurality of deposits of deformable material with said stamp of said stamping tool.

19. The method as set forth in claim 18 wherein said step of placing said integrated circuit substrate on a stamping tool base of a stamping tool comprises the steps of:

placing a first tooling hole alignment button of said stamping tool base within said first tooling hole of said integrated circuit substrate to within a tolerance of less than one hundred microns; and placing a second tooling hole alignment button of said stamping tool base within said second tooling hole of said integrated circuit substrate to within a tolerance of less than one hundred microns.

20. The method as set forth in claim 18 wherein said step of imprinting said plurality of deposits of deformable material with a stamp of said stamping tool comprises the steps of:

aligning a position of said stamp with respect to a location of said first tooling hole in said integrated circuit substrate to within a tolerance of less than one hundred microns;

aligning a position of said stamp with respect to a location of said second tooling hole in said integrated circuit substrate to within a tolerance of less than one hundred microns; and imprinting said plurality of deposits of deformable material with said stamp.

21. The method as set forth in claim 18 wherein said plurality of deposits of deformable material is composed of one of: a metal, a solder material and a polymer material.

22. The method as set forth in claim 18 further comprising the step of heating said deposits of deformable material.

23. The method as set forth in claim 18 further comprising the step of creating at least one geometrical alignment guide feature in at least one deposit of deformable material on said integrated circuit substrate.

* * * * *